United States Patent
Komatsu et al.

(10) Patent No.: US 7,639,717 B2
(45) Date of Patent: Dec. 29, 2009

(54) LASER SOURCE DEVICE AND PROJECTOR EQUIPPED WITH THE LASER SOURCE DEVICE

(75) Inventors: Akira Komatsu, Tatsuno-machi (JP); Kunihiko Yano, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 363 days.

(21) Appl. No.: 11/780,128

(22) Filed: Jul. 19, 2007

(65) Prior Publication Data
US 2008/0079855 A1 Apr. 3, 2008

(30) Foreign Application Priority Data
Aug. 11, 2006 (JP) .............................. 2006-219345
Jun. 4, 2007 (JP) .............................. 2007-147741

(51) Int. Cl.
*H01S 3/10* (2006.01)
(52) U.S. Cl. .......................................... 372/21; 372/22
(58) Field of Classification Search .................. 372/21, 372/22, 99
See application file for complete search history.

(56) References Cited

U.S. PATENT DOCUMENTS

| 5,617,435 A | 4/1997 | Nagai et al. |
| 2006/0023173 A1 | 2/2006 | Mooradian et al. |
| 2006/0023757 A1 | 2/2006 | Mooradian et al. |
| 2006/0268241 A1 | 11/2006 | Watson et al. |
| 2006/0280219 A1 | 12/2006 | Shchegrov |
| 2007/0153862 A1 | 7/2007 | Shchegrov et al. |
| 2007/0153866 A1 | 7/2007 | Shchegrov et al. |

FOREIGN PATENT DOCUMENTS

| CN | 1719672 A | 1/2006 |
| JP | A 4-69987 | 3/1992 |
| JP | A 7-152055 | 6/1995 |
| JP | A-7-202309 | 8/1995 |
| JP | A-7-318996 | 12/1995 |
| JP | A 8-190111 | 7/1996 |
| JP | A-9-127566 | 5/1997 |
| JP | A-9-283851 | 10/1997 |
| JP | A 10-254001 | 9/1998 |

(Continued)

OTHER PUBLICATIONS

Mooradian et al., "High Power Extended Vertical Cavity Surface Emitting Diode Lasers and Arrays and Their Applications," Micro-Optics Conference, Tokyo, Nov. 2, 2005, p. 1-4.

*Primary Examiner*—Armando Rodriguez
(74) *Attorney, Agent, or Firm*—Oliff & Berridge, PLC

(57) ABSTRACT

A laser source device includes a laser source for oscillating a laser beam with a predetermined wavelength, a mirror for reflecting the laser beam emitted from the laser source to form a resonator, and including a dielectric multilayer film having a property of reflecting a light beam with an oscillation wavelength and transmitting a light beam with a conversion wavelength, a wavelength conversion element disposed between the laser source and the mirror for converting the laser beam with the oscillation wavelength emitted- from the laser source and emitting a laser beam with the conversion wavelength, and a bandpass filter disposed between the laser source and the mirror, and including a bandpass filter multilayer film having a bandpass property at least around the oscillation wavelength.

15 Claims, 11 Drawing Sheets

FOREIGN PATENT DOCUMENTS

| | | |
|---|---|---|
| JP | A 2001-223431 | 8/2001 |
| JP | A 2001-284718 | 10/2001 |
| JP | A 2001-308454 | 11/2001 |
| JP | A 2005-33126 | 2/2005 |
| JP | A 2006-60206 | 3/2006 |

LASER SOURCE DEVICE AND PROJECTOR EQUIPPED WITH THE LASER SOURCE DEVICE

BACKGROUND

1. Technical Field

The present invention relates to a laser source device for emitting a laser beam, a projector equipped with the laser source device.

2. Related Art

In recent years, in an opto-electronics field such as optical communications, optical application measurement, or optical displays, laser source devices, which use an oscillation beam from a semiconductor laser source after converting the wavelength thereof, have widely been used. As such a laser source device, there is known a second harmonic wave beam generating device, which is provided with a semiconductor laser source having a mirror structure formed on one end surface and a non-reflecting structure formed on the opposing surface and a non-linear optical member having a mirror structure formed on its light oscillating surface and a non-reflecting structure formed on the opposing surface, and forms a resonator structure between the mirror structures of the semiconductor laser source and the non-linear optical member, thereby generating green light or blue light (see, for example, Japanese Patent No. 3300429(Document 1)).

Further, there is proposed an external resonance laser, which is provided with a semiconductor laser oscillator for emitting a laser beam with a predetermined wavelength and an external resonator for resonating the laser beam emitted from the semiconductor laser oscillator, the external resonator being provided with a photopolymer volume hologram, and the photopolymer volume hologram diffracting the laser beam emitted from the semiconductor laser oscillator and making it enter an optical system inside a resonator, and selectively transmitting the laser beam with a predetermined wavelength and emitting it to the outside in order for stably supplying a laser beam with a narrow wavelength band (see, for example, JP-A-2001-284718 (Document 2)).

However, since in the second harmonic wave beam generating device in the related art as described in the Document 1, the laser beam is not narrow-banded, there remains a problem that the oscillation wavelength of the semiconductor laser source varies in accordance with variation in temperature or that the oscillation wavelength band of the laser beam emitted from the light source is so wide with respect to the allowable band of conversion wavelength of a wavelength conversion element (the same as the non-linear optical member) that an amount of light in the wavelength band in which the wavelength conversion is not performed is large resulting in low conversion efficiency.

On the other hand, the photopolymer volume hologram used for the external resonance laser as described in the Document 2, which is an element composed of a number of interference patterns with different refractive indexes formed in resin in a stacked manner and for narrow-banding the laser beam with the oscillation wavelength and then reflecting it, for example, is an expensive element admitting that it can compose the external resonance laser with a simple configuration. Thus, a problem of increasing the manufacturing cost arises.

SUMMARY

An advantage of some aspects of the invention is to provide a laser source device capable of preferably emitting a laser beam as well as allowing cost reduction and downsizing and a projector equipped with the laser source device.

A laser source device according to an aspect of the invention includes a laser source for oscillating a laser beam with a predetermined wavelength, a mirror for reflecting the laser beam emitted from the laser source to form a resonator, and including a dielectric multilayer film having a property of reflecting a light beam with an oscillation wavelength and transmitting a light beam with a conversion wavelength, a wavelength conversion element disposed between the laser source and the mirror for converting the laser beam with the oscillation wavelength emitted from the laser source and emitting a laser beam with the conversion wavelength, and a bandpass filter disposed between the laser source and the mirror, and including a bandpass filter multilayer film having a bandpass property at least around the oscillation wavelength.

According to this configuration, in the bandpass filter multilayer film disposed between the laser source and the mirror, the oscillation wavelength of the laser beam emitted from the laser source is narrow-banded to have a half-power bandwidth of no greater than 1 nm. Thus, the conversion efficiency of the wavelength conversion in the wavelength conversion element is improved, and further, even if variation in the oscillation wavelength of the laser source is caused by the temperature variation in the use environment, the laser beam with a constant wavelength can always be emitted from the laser source device.

Further, since the mirror has a property of reflecting the light with the oscillation wavelength and transmitting the light with the conversion wavelength, it is possible to efficiently take out the laser beam wavelength-converted by the wavelength conversion element while keeping the oscillated light of the laser source inside the resonator.

Further, in the laser source device according to another aspect of the invention, it is preferable that the mirror is composed of a dielectric multilayer film formed on the exit side surface of the wavelength conversion element, and a bandpass filter is composed of the bandpass filter multilayer film formed between the laser source and the wavelength conversion element.

According to this configuration, in the bandpass filter multilayer film formed between the laser source and the wavelength conversion element, the oscillation wavelength of the laser beam emitted from the laser source is narrow-banded to have a half-power bandwidth of no greater than 1 nm. Thus, the conversion efficiency of the wavelength conversion in the wavelength conversion element is improved, and further, even if variation in the oscillation wavelength of the laser source is caused by the temperature variation in the use environment, the laser beam with a constant wavelength can always be emitted from the laser source device. Further, by providing the bandpass filter provided with the bandpass filter multilayer film formed between the laser source and the wavelength conversion element, it becomes possible to adjust various characteristics of the wavelength conversion element and the bandpass filter independently of each other, thus improvement of the oscillation efficiency and the yield can be expected. Further, since the mirror is formed on the exit side surface of the wavelength conversion element, the number of composing elements can be reduced, thus the laser source device, cost reduction and downsizing of which have been achieved, can be obtained.

Further, in the laser source device according to another aspect of the invention, the bandpass filter is preferably composed of the bandpass filter multilayer film formed on the entrance side surface of the wavelength conversion element.

According to the present configuration, in the bandpass filter multilayer film formed on the entrance side surface of the wavelength conversion element, the oscillation wavelength of the laser beam emitted from the laser source is narrow-banded to have a half-power bandwidth of no greater than 1 nm. Thus, the conversion efficiency of the wavelength conversion in the wavelength conversion element is improved, and further, even if variation in the oscillation wavelength of the laser source is caused by the temperature variation in the use environment, the laser beam with a constant wavelength can always be emitted from the laser source device. Further, since the bandpass filter multilayer film is formed on the entrance side surface of the wavelength conversion element, the number of composing elements can be reduced, thus the laser source device, cost reduction and downsizing of which have been achieved, can be obtained.

Further, in the laser source device according to another aspect of the invention, it is preferable that the mirror is formed of a transparent member provided with a dielectric multilayer film formed on the exit side surface of the wavelength conversion element, and the bandpass filter is composed of the bandpass filter multilayer film formed between the laser source and the wavelength conversion element.

According to the present configuration, since the mirror is formed of a transparent member provided with a dielectric multilayer film formed on the exit side surface of the wavelength conversion element, and the bandpass filter is composed of the bandpass filter multilayer film formed between the laser source and the wavelength conversion element, it becomes possible to adjust various characteristics of the wavelength conversion element, the mirror, and the bandpass filter independently of each other, thus improvement of the oscillation efficiency and the yield can be expected.

Further, in the laser source device according to another aspect of the invention, the bandpass filter is preferably composed of the bandpass filter multilayer film formed on the entrance side surface of the wavelength conversion element.

According to the present configuration, since the bandpass filter is composed of the bandpass filter multilayer film formed on the entrance side surface of the wavelength conversion element, it becomes possible to adjust various characteristics of the wavelength conversion element, and the bandpass filter independently of each other, thus improvement in the oscillation efficiency and the yield can be expected.

Further, in the laser source device according to another aspect of the invention, it is preferable that the mirror is formed of a transparent member provided with a dielectric multilayer film formed on the exit side surface of the wavelength conversion element, and the bandpass filter is composed of the bandpass filter multilayer film formed between the mirror and the wavelength conversion element.

According to the present configuration, since the mirror is formed of a transparent member provided with a dielectric multilayer film formed on the exit side surface of the wavelength conversion element, and the bandpass filter is composed of the bandpass filter multilayer film formed between the mirror and the wavelength conversion element, it becomes possible to adjust various characteristics of the wavelength conversion element, the mirror, and the bandpass filter independently of each other, thus improvement in the oscillation efficiency and the yield can be expected.

Further, in the laser source device according to another aspect of the invention, it is preferable that the bandpass filter multilayer film further has a property of reflecting the laser beam with the conversion wavelength.

According to the present configuration, since the bandpass filter multilayer film further has the property of reflecting the laser beam with the conversion wavelength, the conversion beam generated from the laser beam with the conversion wavelength, which has been reflected by the dielectric multilayer film of the mirror and has reentered the wavelength conversion element, by the wavelength conversion element is reflected by the bandpass filter multilayer film, and emitted from the laser source device passing through the wavelength conversion element. Thus, the conversion beam generated from the returning beam, which returns to the laser source can effectively be taken out from the laser source device, thus the output of the conversion beam can be reinforced.

Still further, in the laser source device according to another aspect of the invention, it is preferable that the bandpass filter multilayer film further has a property of transmitting the laser beam with the conversion wavelength.

According to the present configuration, since the bandpass filter multilayer film further has the property of transmitting the laser beam with the conversion wavelength, the conversion beam generated by the wavelength conversion element is transmitted through the bandpass filter multilayer film and is emitted from the laser source device. Thus, the conversion beam can effectively be taken out from the laser source device, thus the output of the conversion beam can be reinforced.

Further the laser source device according to another aspect of the invention preferably includes a dielectric multilayer film having a property of transmitting the laser beam with the oscillation wavelength and reflecting the laser beam with the conversion wavelength disposed on a surface of an entrance side of the wavelength conversion element.

According to the present configuration, since the bandpass filter multilayer film formed on the entrance surface of the wavelength conversion element reflects the laser beam with conversion wavelength, the conversion beam generated from the laser beam with the conversion wavelength, which has been reflected by the dielectric multilayer film of the mirror and has reentered the wavelength conversion element, by the wavelength conversion element is reflected by the multilayer film of the wavelength conversion element, and emitted from the laser source device passing through the wavelength conversion element. Thus, the conversion beam generated from the returning beam, which returns to the laser source can effectively be taken out from the laser source device, thus the output of the conversion beam can be reinforced.

Further, in the laser source device according to another aspect of the invention, the bandpass filter multilayer film preferably has high refractive index layers H and low refractive index layers L stacked alternately with optical film thicknesses in sequence from the side of the wavelength conversion element, assuming the oscillation wavelength as $\lambda$, 0.236 $\lambda H$, 0.355 $\lambda L$, 0.207 $\lambda H$, 0.203 $\lambda L$, (0.25 $\lambda H$, 0.25 $\lambda L$)n, 0.5 $\lambda H$, (0.25 $\lambda L$, 0.25 $\lambda H$)n, 0.266 $\lambda L$, 0.255 $\lambda H$, 0.248 $\lambda L$, 0.301 $\lambda H$, and 0.631 $\lambda L$, where n is a value in a range from 3 to 10, and denotes the number of times of repeating stacking the layers in the parentheses.

According to the present configuration, since the bandpass filter multilayer film is formed by alternately stacking the high refractive index layer H and the low refractive index layer L, it has the bandpass property around the oscillation wavelength, it becomes possible to narrow-band the oscillation wavelength of the laser beam emitted from the laser source to 1 nm or smaller in the half-power bandwidth as described above. Thus, the conversion efficiency of the wavelength conversion in the wavelength conversion element is improved, and further, even if variation in the oscillation wavelength of the laser source is caused by the temperature variation in the use environment, the laser beam with a constant wavelength can always be emitted from the laser source device. It should be noted that in the bandpass filter provided with the bandpass filter multilayer film, the higher the transmission of the transparent substrate forming the bandpass filter with respect to the transmission wavelength is, the smaller the loss of the transmission wavelength becomes, thus the conversion efficiency of the laser source device can be improved.

Further, in the laser source device according to another aspect of the invention, it is preferable that the bandpass filter is tiltable with respect to the laser beam emitted from the laser source.

According to the present configuration, since the bandpass filter for narrow-banding the laser beam with the oscillation wavelength is configured to be tiltable to the laser beam emitting surface of the laser source, by changing the angle between the laser beam and the center axis of the bandpass filter, namely the incident angle of the laser beam entering the bandpass filter with respect to the center axis of the bandpass filter, the wavelength of the laser beam transmitted, through the bandpass filter can be changed. Thus, even if the shift is caused in the wavelength of the transmission light by a manufacturing error of the bandpass filter and so on, it becomes possible to tune it to the conversion wavelength of the wavelength conversion element by fine-tuning, thus it becomes possible to further improve the oscillation efficiency and the wavelength conversion efficiency of the laser beam, and to emit a more preferable laser beam from the laser source device.

Further, in the laser source device according to another aspect of the invention, it is preferable that the transparent member on which the mirror is formed is made of a material having a transmission of 80 percent or higher with respect to the conversion wavelength and having a transmission of 20 percent or lower with respect to the oscillation wavelength.

According to the present configuration, in the mirror provided with the dielectric multilayer film, since the transparent member forming the mirror is made of a material having a transmission of 80 percent or higher to the conversion wavelength and a transmission of 20 percent or lower to the oscillation wavelength, by absorbing the oscillation light, which is failed to be reflected by the mirror, inside the member, it can be prevented that the oscillation light is emitted to the outside from the laser source device. Thus, the laser source device with improved safety can be obtained.

Further, in the laser source device according to another aspect, of the invention, it is preferable that the laser source is one of an edge emitting semiconductor laser, a surface emitting semiconductor laser, and a diode-pumped solid-state laser.

According to the present configuration, since the laser source is one of an edge emitting semiconductor laser, a surface emitting semiconductor laser, and a diode-pumped solid-state laser, the compact and high-efficiency laser source device can be obtained.

Further, in the laser source device according to another aspect of the invention, the wavelength conversion element is preferably a second harmonic wave generating element having a periodic polarization inversion structure.

According to the present configuration, since the wavelength conversion element forming the laser source device is a second harmonic wave generating element, a narrow-banded laser beam (monochromic visible light) can be generated from the laser beam in the near-infrared region emitted from the laser source. In particular, the green laser beam, which can be hardly obtained by the laser diode, can easily be obtained.

A projector according to another aspect of the invention includes a laser source device for emitting a laser beam, a light modulation element for modulating the laser beam emitted from the laser source device in accordance with image information, and a projection optical system for emitting the modulated laser beam, and the laser source device is preferably as described above.

According to the present configuration, since the projector using the laser source device as described above has laser source devices independently for the respective three primary colors, red, blue, and green, the filters such as color separation filters can be eliminated, and further, since the laser beam emitted from the laser source device is linearly-polarized light, the polarization changer element can be eliminated, thus a simplified optical mechanism can be obtained. Thus, a projector allowing the cost reduction and the downsizing can be obtained. Further, since the laser beam with the improved oscillation efficiency and the improved wavelength conversion efficiency is emitted from the laser source device, the projector having a wide color reproduction area can be provided.

BRIEF DESCRIPTION OF THE DRAWINGS

The invention will now be described with reference to the accompanying drawings, wherein like numbers refer to like elements.

DESCRIPTION OF EXEMPLARY EMBODIMENTS

Embodiments of the invention will hereinafter be explained with reference to the accompanying drawings.

First Embodiment

Principal Configuration of Rear Projector

Figure 1:
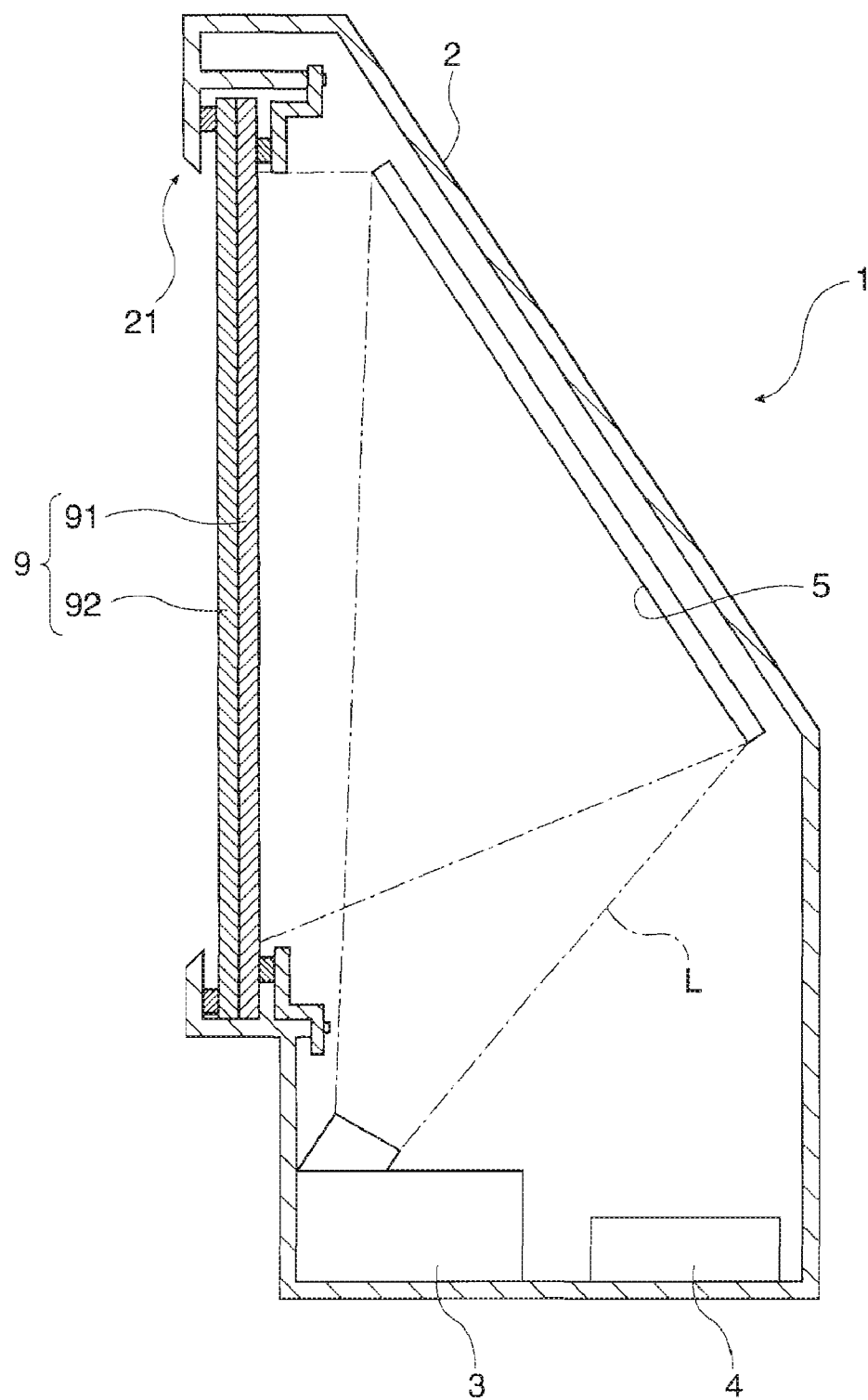
FIG. 1 is a side cross-sectional view of a rear projector according an embodiment of the invention.

FIG. 1 is a side cross-sectional view of a rear projector as a projector according to an embodiment of the invention.

In FIG. 1, the rear projector 1 is configured including a cabinet 2, a projector unit 3, a control unit 4, a reflecting mirror 5, and a transmissive screen 9.

The cabinet 2 is formed like a box with an inclined portion on the rear side (the right side in FIG. 1) thereof, and housing the projector unit 3, the control unit 4, and the reflecting mirror 5 disposed inside thereof. It should be noted that although omitted from the specific drawings, inside the cabinet 2 there are also disposed a power supply unit for supplying each of the composing members of the rear projector 1 with power, a cooling unit for cooling the inside of the rear projector 1, an audio output section for outputting the sound, and so on besides the projector unit 3, the control unit 4, and the reflecting mirror 5.

Further, on the front side (the left side in FIG. 1) of the cabinet 2 there is formed an opening section 21 with a rectangular planar shape, and the transmissive screen 9 is supported by and fixed to the periphery of the opening section 21.

The projector unit 3 is disposed inside and on the bottom of the cabinet 2, and forms an image beam L in accordance with an image signal output from the control unit 4 to emit the image beam L to the reflecting mirror 5, thereby enlargedly projecting the image on the mirror surface of the reflecting mirror 5. The specific configuration of the projector unit 3 will be described later.

Although omitted from a specific drawing, the control unit 4 is configured including, for example, a tuner, an IF circuit, an audio detection circuit, a video detection circuit, an amplifier circuit, a central processing circuit (CPU), and so on, and performs an overall control of the projector unit 3. Further, the control unit 4 extracts a broadcasting signal with a frequency corresponding to a channel selected in accordance with, for example, an operation of a remote controller (not shown), and outputs the image signal corresponding thereto to the projector unit 3 and at the same time outputs the audio signal to the sound output section (not shown).

The reflecting mirror 5 is disposed inside and on the upper rear side of the cabinet 2, and reflects the image beam L emitted from the projector unit 3 toward the rear side of the transmissive screen 9.

The transmissive screen 9 has a rectangular shape, and is supported by and fixed to the periphery of the opening section 21 of the cabinet 2. The transmissive screen 9 is composed of a Fresnel lens sheet 91 disposed on the rear side and a lenticular lens sheet 92 disposed on the front side. Further, the transmissive screen 9 converts the image beam L entering via the reflecting mirror 5 into parallel, light with a Fresnel lens sheet 91, and further converts the parallel light into expanded (diffused) light with the lenticular lens sheet 92, thereby projecting the image beam from the rear side to the front side to display the projection image.

Configuration of Projector Unit

Figure 2:
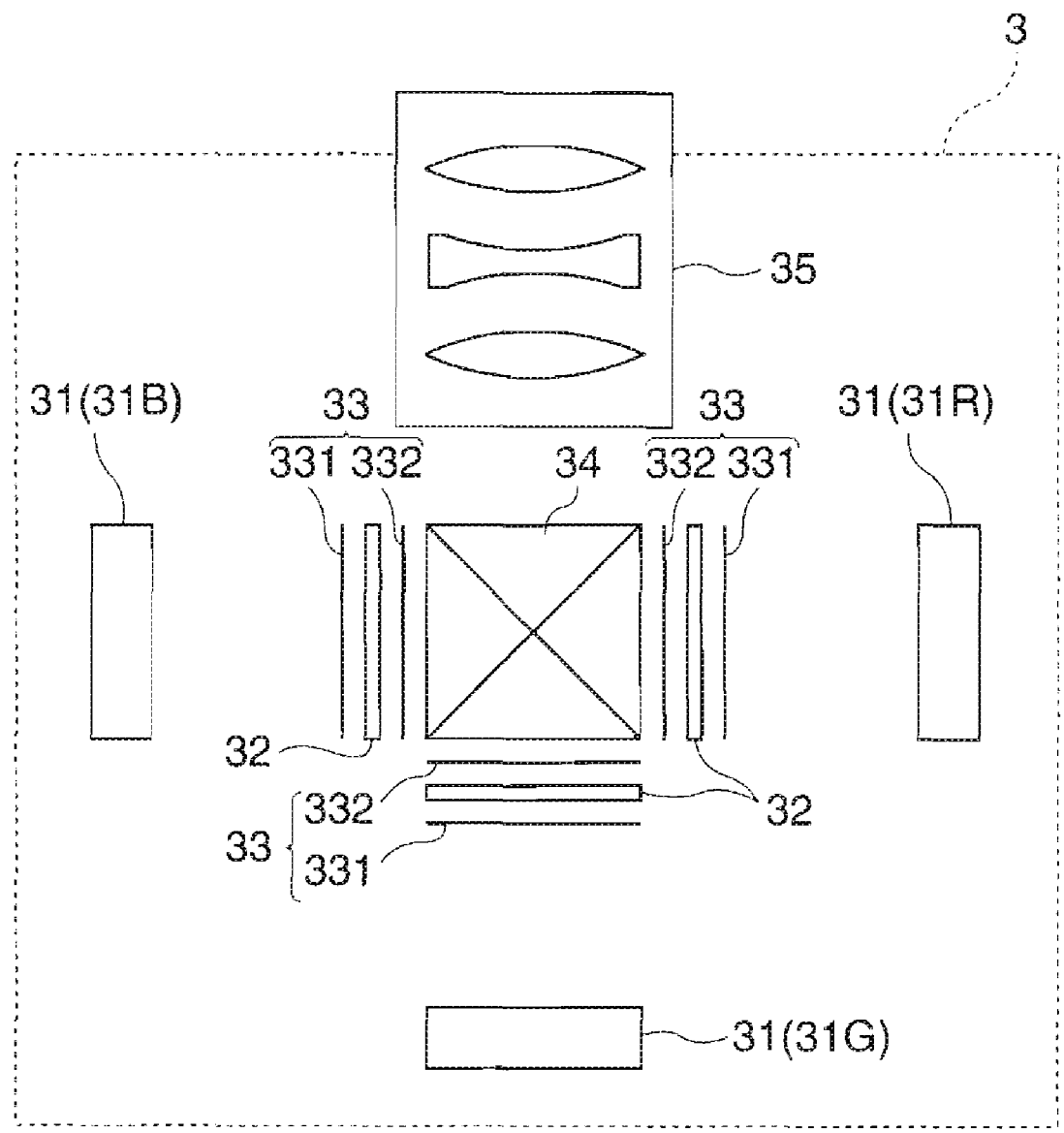
FIG. 2 is a schematic diagram showing a rough configuration of an optical system formed in a projector unit.

The configuration of the projector unit 3 will hereinafter be explained. FIG. 2 is a schematic diagram showing a rough configuration of an optical system formed in the projector unit.

In FIG. 2, the projector unit 3 is provided with laser source devices 31, liquid crystal panels 32, polarization plates 33, a cross dichroic prism 34, a projection lens 35, and so on. It should be noted that the liquid crystal panels 32, the polarization plates 33, and the cross dichroic prism 34 form a light modulation element.

As the laser source devices 31, there are provided a red light source device 31R for emitting a red laser beam, a blue light source device 31B for emitting a blue laser beam, and a green light source device 31G for emitting a green laser beam, each lighting in accordance with a control signal input from the control unit 4 to emit the laser beam towards the liquid crystal panel 32. These laser source devices 31 are each disposed so as to oppose to respective one of the three side face directions of the cross dichroic prism 34. In this case, the laser source devices 31 (31R, 31B, 31G) are disposed so that the red light source device 31R and the blue light source device 31B face each other across the cross dichroic prism 34, and the projection, lens 35 and the green light source device 31G face each other across the cross dichroic prism 34. It should be noted that the detailed explanations of these laser source devices 31 will be described later.

The liquid crystal panel 32 uses, for example, polysilicon thin film transistors (TFT) as switching elements, and the colored light, beams emitted from the respective laser source devices 31 are modulated by the respective three liquid crystal panels 32 and the polarization plates 33 disposed on both entrance and exit sides of the liquid crystal panels 32 in accordance with the image information to form the optical image.

The polarization plate 33 is provided with an entrance side polarization plate 331 disposed on an anterior side of the liquid crystal panel 32 in the light path and an exit side polarization plate 332 disposed on a posterior side thereof in the light path.

The entrance side polarization plate 331 is formed by providing a polarization film to a substrate made of quartz crystal, sapphire, or the like, and only transmits the polarized light beam in a predetermined polarizing direction out of the colored light beams emitted from each of the laser source device 31 while absorbing other light beams. The exit side polarization plate 332 is also configured substantially equally to the entrance side polarization plate 331, and transmits only the polarized light beam with the predetermined polarizing direction out of the light beams emitted from the liquid crystal panel 32 and absorbs other light beams. The entrance side polarization plate 331 and the exit side polarization plate 332 are arranged to have polarization axes, respectively, whose directions are perpendicular to each other.

It should be noted that it is possible to form the entrance side polarization plate 331 and the exit side polarization plate 332 by disposing polarization films on the entrance surface of the cross dichroic prism 34 without using the substrates or by adhering the substrates to the cross dichroic prism 34.

The cross dichroic prism 34 is an optical element for combining optical images modulated for respective colored light beams output from the respective liquid crystal panels 32 to form a color image. The cross dichroic prism 34 has a substantially rectangular planar shape formed of four rectangular prisms bonded with each other, and on the interfaces on which the rectangular prisms are bonded with each other, there are formed two dielectric multilayer films. These dielectric multilayer films reflect each colored light beam emitted from the respective one of the liquid crystal panels 32 facing each other, and transmits the colored light beam emitted from the liquid crystal panel 32 facing the projection lens 35. As described above, each of the colored light beams modulated by the respective one of the liquid crystal panels 32 is thus combined to form a color image.

The projection, lens 35 as the projection optical system is configured as a combination lens in which a plurality of lenses is combined with each other. Then, the projection lens 35 forms an image beam L based on the color image formed by the cross dichroic prism 34, and enlargedly projects it towards the reflecting mirror 5 (see FIG. 1).

Configuration of Laser Source Device

The configuration of the laser source device 31 will hereinafter be described. It should be noted that as the laser source devices 31, each of the red light source device 31R, the blue light source device 31B, and the green light source device 31G has a similar basic structure.

Figure 3:
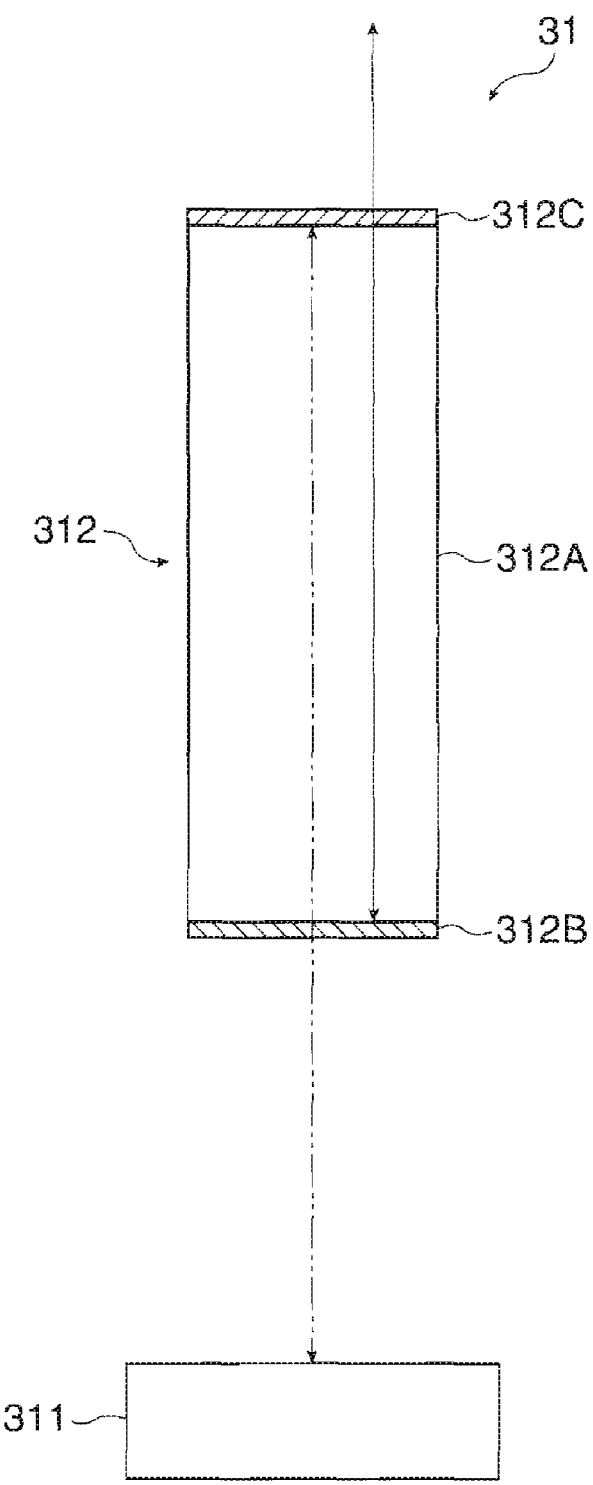
FIG. 3 is a diagram showing a schematic configuration of a laser source device according to a first embodiment.
Figure 4:
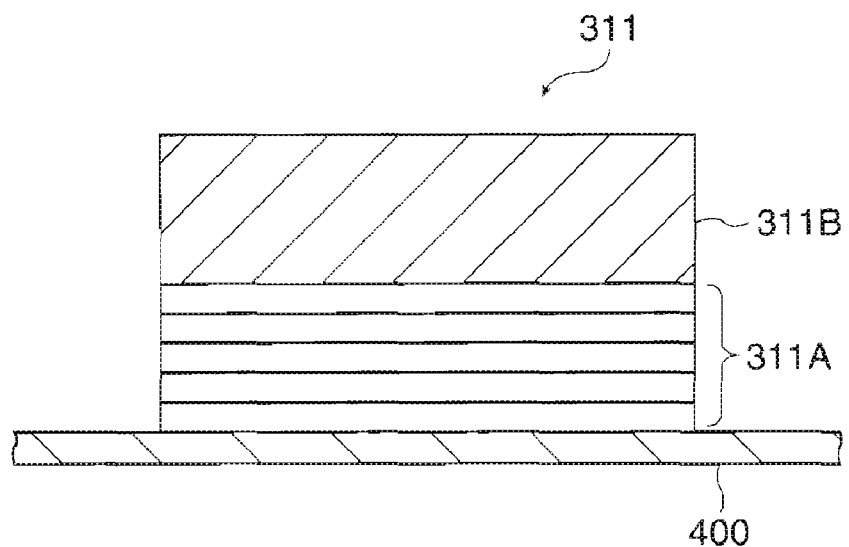
FIG. 4 is a cross-sectional view schematically showing a rough outline of a laser source.
Figure 5:
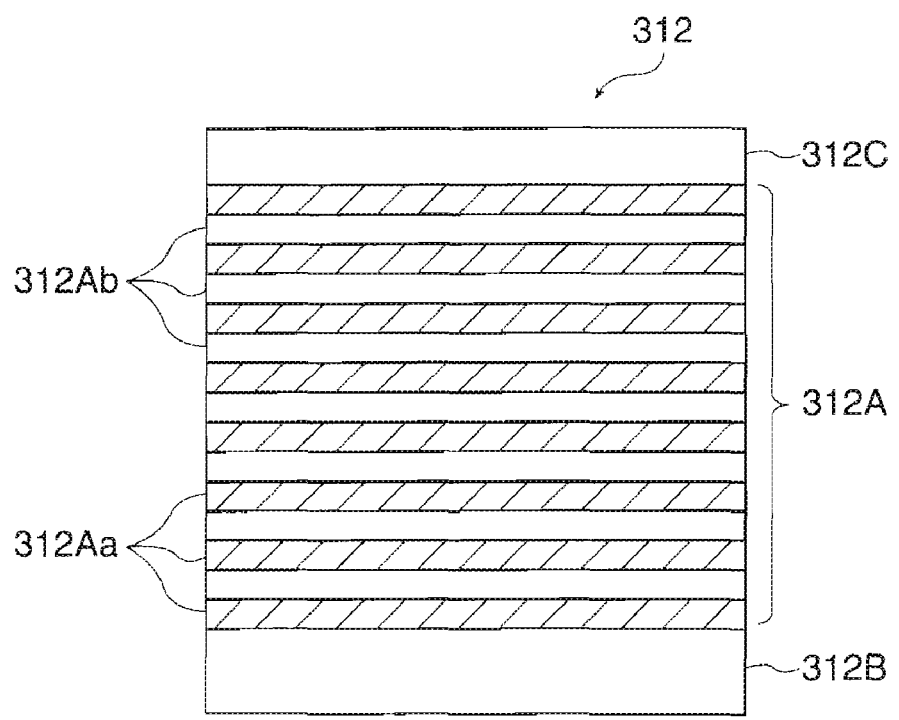
FIG. 5 is a cross-sectional view schematically showing a rough outline of a wavelength conversion element.

FIG. 3 is a diagram showing a schematic configuration of the laser source device according to the first embodiment. FIG. 4 is a cross-sectional view schematically showing a rough outline of the laser source, and FIG. 5 is a cross-sectional view schematically showing a rough outline of the wavelength conversion element.

In FIG. 3, the laser source device 31 is provided with a laser source 311 for emitting a laser beam and a wavelength conversion element 312.

The laser source 311 is a so-called surface emitting semiconductor laser, and is formed on a substrate 400, a semiconductor wafer, as shown in FIG. 4, and is provided with a mirror layer 311A having a function as a reflecting mirror, and a laser medium 311B stacked on the surface of the mirror layer 311A.

The mirror layer 311A is formed directly on the substrate 400. Specifically, the mirror layer 311A is formed by stacking a dielectric layer with a high refractive index and a dielectric layer with a low refractive index in layers using a chemical vapor deposition (CVD) method or the like in the wafer manufacturing process of the substrate 400. The thickness of each of the layers is arranged to satisfy the condition in which the reflected light beams interfere with and reinforce each other in consideration of the wavelength of the laser beam and the refractive index of each the layers.

The laser medium 311B is formed on the top surface of the mirror layer 311A. This laser medium 311B is provided with current supply means not shown in the drawings connected thereto, and oscillates a laser beam with a predetermined wavelength in response to a predetermined amount of current flowing from the current supply means. Further, the laser medium 311B amplifies the laser beam with an oscillation wavelength transmitted therethrough. In other words, the laser beam reflected by the mirror layer 311A or the wavelength conversion element 312 described later is amplified by resonating with the laser beam newly emitted by the laser medium 311B, and emitted from the laser medium 311B (the laser beam emission surface) in a direction substantially perpendicular to the mirror layer 311A (the substrate 400).

Hereinafter, the wavelength of the laser beam emitted from the laser medium 311B is described as an oscillation wavelength. The schematic condition of the oscillation wavelength is illustrated with a chain double-dashed line in FIG. 3, and will also be illustrated with a chain double-dashed line in each of the drawings in other embodiments described hereinafter.

The wavelength conversion element 312 is disposed on the light path of the laser beam emitted from the laser source 311 so as to face the laser emission surface (the laser medium 311B) of the laser source 311.

As shown in FIG. 5, the wavelength conversion element 312 is provided with a wavelength conversion element section 312A, a bandpass filter multilayer film 312B formed on a laser source 311 side surface (hereinafter referred to as an entrance surface) of the wavelength conversion element 312 (the wavelength conversion element section 312A), and a dielectric multilayer film 312C as a mirror formed on the surface (hereinafter referred to as an exit surface) opposed to the entrance surface of the wavelength conversion element 312 (the wavelength conversion element section 312A).

The bandpass filter multilayer film 312B has a film configuration in which high refractive index layers H and low refractive index layers L are alternately stacked to have optical film thicknesses in sequence from the wavelength conversion element side, assuming the oscillation wavelength as $\lambda$, 0.236 $\lambda$H, 0.355 $\lambda$L, 0.207 $\lambda$H, 0.203 $\lambda$L, (0.25 $\lambda$H, 0.25 $\lambda$L)n, 0.5 $\lambda$H, (0.25 $\lambda$L, 0.25 $\lambda$H)n, 0.266 $\lambda$L, 0.255 $\lambda$H, 0.248 $\lambda$L, 0.301 $\lambda$H, and 0.631 $\lambda$L. It should be noted that n is a value in a range from 3 to 10, and denotes the number of times of repeating stacking the layers in the parentheses.

As a material of the high refractive index layer H, one material is selected from the materials transparent in the objective wavelength band and environmentally friendly such as $Ta_2O_5$, $Nb_2O_5$, $TiO_2$, and $ZrO_2$, and as a material of the low refractive index layer L, one material is similarly selected from the environmentally friendly materials such as $SiO_2$ and $MgF_2$.

Figure 6:
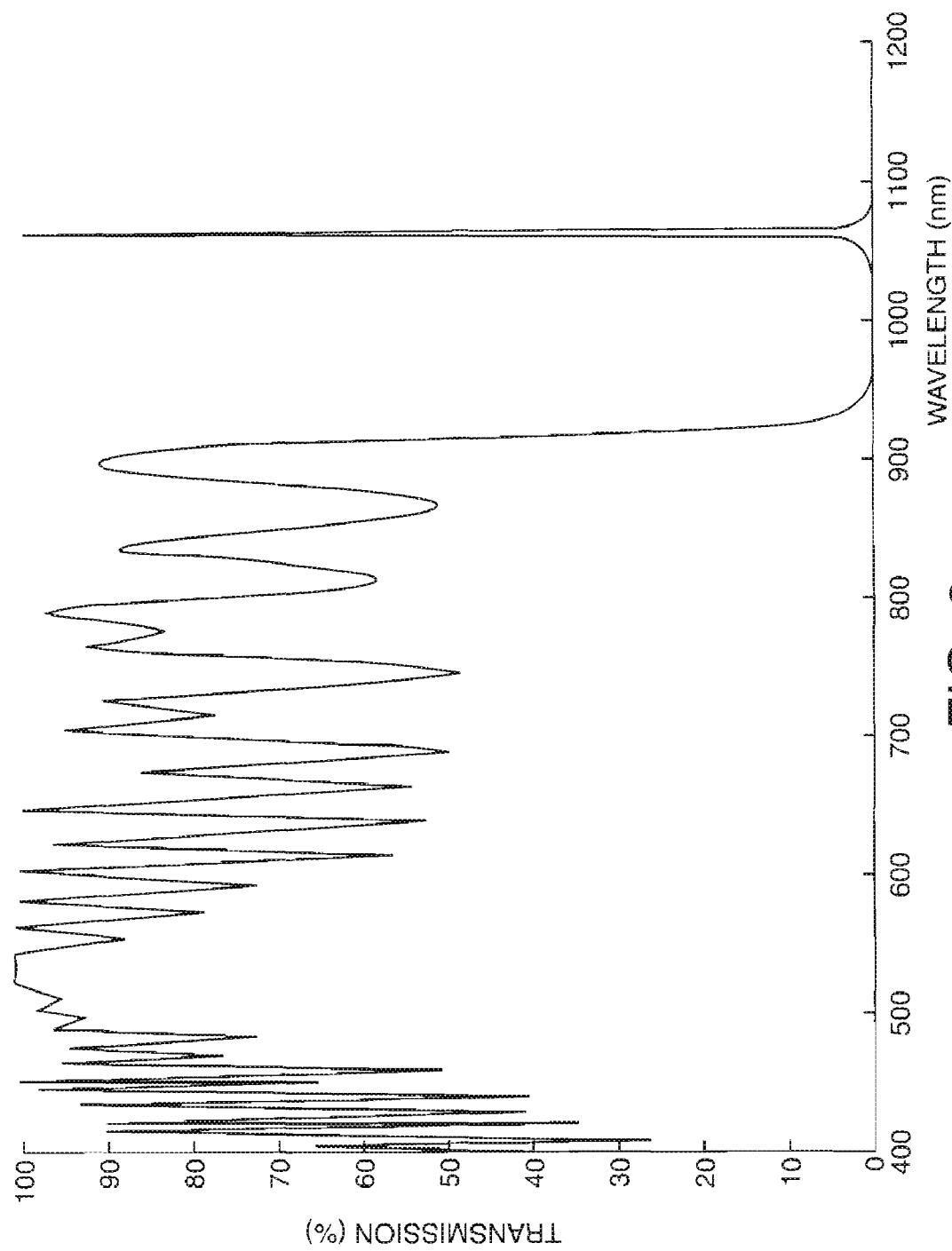
FIG. 6 is a graph showing an example of a characteristic of a spectral transmission factor of a bandpass filter multilayer film.

FIG. 6 is a graph showing an example of a characteristic of a spectral transmission factor of the bandpass filter multilayer film 312B formed as described above. The horizontal axis of the graph represents the wavelength (nm) while the vertical axis thereof represents the transmission factor (%).

Such a bandpass filter multilayer film 312B has a bandpass characteristic in the vicinity of the oscillation wavelength. In other words, using the interference phenomenon of light by the thin films thus formed, only the laser beam with a predetermined specific wavelength is selectively transmitted out of the laser beams with the oscillation wavelength emitted by the laser source 311, and the laser beams with other oscillation wavelengths are reflected. Therefore, it has a function of narrow-banding the laser beam with an oscillation wavelength. The laser beam with the specific wavelength selectively transmitted through the bandpass filter multilayer film 312B is a laser beam with a half-power bandwidth of about 0.5 nm in the setting wavelength.

Further, the bandpass filter multilayer film 312B has a property of reflecting a light beam with the conversion wavelength converted by the wavelength conversion element 312 (the wavelength conversion element section 312A) described later. It should be noted that in order for effectively taking out the conversion beam from the laser source device, the bandpass filter multilayer film 312B preferably has a high reflectance with respect to the conversion wavelength, and the reflectance of no lower than 80 percent is required.

The wavelength conversion element section 312A is a second harmonic wave generation (SHG) element for generating the second harmonic wave of the laser beam with the oscillation wavelength, which is a bulk chip forming a periodic polarization inversion structure to perform the wavelength conversion by quasi phase matching (QPM), and thus generating the second harmonic wave with a wavelength half as long as the oscillation wavelength.

The wavelength conversion element section 312A has a polarization inversion structure formed by alternately forming a number of pairs of areas 312Aa and 312Ab having polarization directions reversed from each other inside a crystal substrate of an inorganic non-linear optical material such as lithium niobate (LN: $LiNbO_3$) or lithium tantalate (LT: $LiTaO3$) in a direction substantially perpendicular to the optical axis of the laser beam emitted from the laser source 311 at predetermined intervals. The predetermined interval between the pair of areas 312Aa and 312Ab formed alternately is appropriately determined in accordance with the oscillation wavelength of the laser beam oscillated by the laser source 311 and the refractive index dispersion of the wavelength conversion element section 312A.

The wavelength conversion element section 312A performs the wavelength conversion on the laser beam having the oscillation wavelength narrow-banded by being transmitted through the bandpass filter multilayer film 312B, and generates the second harmonic wave having a wavelength half as long as the oscillation wavelength. Hereinafter, the wavelength converted by the wavelength conversion element 312 is referred to as a conversion wavelength. The schematic condition of the conversion wavelength is illustrated with a solid line in FIG. 3, and will also be illustrated with a solid line in each of the drawings in other embodiments described hereinafter.

In generation of the second harmonic wave, for example, from a near-infrared laser beam with the oscillation wavelength of 1064 nm oscillated from the laser source 311, a green laser beam (a visible light) with a wavelength of 532 nm, half as long as the original wavelength is generated. It should be noted that, the allowable wavelength range of the light beam on which the wavelength conversion is performed in the wavelength conversion element section 312A is about 0.3 nm, which varies for 0.1 nm/° C. with respect to the variation in the temperature of the use environment.

The dielectric multilayer film 312C has a function of selectively transmitting the laser beam (the second harmonic wave) with the conversion wavelength converted to be half as long as the original wavelength in the wavelength conversion element section 312A, and at the same time reflecting the laser beams with other wavelengths. For example, in the green light source device 31G, the green laser beam having the conversion wavelength of 532 nm is transmitted while the laser beam with the oscillation wavelength other than the green laser beam is reflected. In this case, in order for improving the oscillation efficiency, the dielectric multilayer film 312C preferably has a high reflectance to the laser beam having the oscillation wavelength, and the reflectance no lower than 80 percent is required. On the other hand, in order for effectively taking out the conversion beam from the laser source device, the dielectric multilayer film 312C preferably has a high transmission to the laser beam having the conversion wavelength, and the transmission no lower than 80 percent is required. It should be noted that the laser beam reflected in the dielectric multilayer film 312C includes the laser beam with the oscillation wavelength, which has not been converted in the wavelength conversion element section 312A, and a part of the laser beam with the conversion wavelength, which should have been transmitted through the dielectric multilayer film 312C.

Operation of Laser Source Device

The operation of the laser source device 31 will be explained with reference to FIGS. 3 through 6.

When an electrical current is supplied to the laser medium 311B of the laser source 311, the laser source device 31 oscillates a laser beam with a predetermined wavelength under the control of the control unit 4 (see FIG. 1). For example, in the green light source device 31G, the near-infrared laser beam with a wavelength of 1064 nm is oscillated. In this case, the laser beam proceeding in a direction substantially perpendicular to the substrate 400 out of the oscillated laser beams is emitted from the end face (laser beam exit surface) of the laser medium 311B on the side of the wavelength conversion element 312. Further, the laser beam proceeding towards the side of the substrate 400 is also reflected by the mirror layer 311A, and is emitted towards the side of the wavelength conversion element 312 after passing through the laser medium 311B again.

Then, the laser beam with the oscillation wavelength emitted from the laser source device 31 enters the wavelength conversion element 312.

The laser beam with the oscillation wavelength thus entering the wavelength conversion element 312 first enters the bandpass filter multilayer film 312B formed on the entrance surface of the wavelength conversion element section 312A, and the laser beam with the half-power bandwidth of about 0.5 nm in the oscillation wavelength is transmitted while the laser beams with other oscillation wavelengths are reflected. In other words, narrow banding of the oscillation wavelength is performed.

On the contrary, the laser beam with the oscillation wavelength transmitted through the bandpass filter multilayer film 312B of the wavelength conversion element 312 enters the wavelength conversion element section 312A.

A part of the laser beam with the oscillation wavelength entering the wavelength conversion element section 312A is wavelength-converted, and the laser beam, which is the second harmonic wave with the wavelength (conversion wavelength) converted to be half as long as the original wavelength, is generated.

Then, the laser beam with the conversion wavelength, which is wavelength-converted in the wavelength conversion element section 312A, and the beam with the oscillation wavelength, which has not been wavelength-converted, enter the dielectric multilayer film 312C formed on the exit surface of the wavelength conversion element section 312A.

In the dielectric multilayer film 312C, the laser beam with the conversion wavelength converted to be half as long as the original wavelength in the wavelength conversion element section 312A is transmitted, and at the same time, other laser beams (the laser beams with oscillation wavelength not converted in the wavelength conversion element section 312A and a part of the laser beam with the conversion wavelength) are reflected.

The laser beam with the conversion wavelength transmitted through the dielectric multilayer film 312C is a monochromic visible light beam, and is emitted from the wavelength conversion element 312 (the laser source device 31) towards the liquid crystal panel 32.

The laser beam with the oscillation wavelength not converted in the wavelength conversion element section 312A and a part of the laser beam with the conversion wavelength both reflected in the dielectric multilayer film 312C reenters the wavelength conversion element section 312A and is then wavelength-converted. In this case, since the laser beam with the oscillation wavelength entering the wavelength conversion element section 312A has already been narrow-banded in the wavelength, the conversion efficiency in the wavelength conversion element section 312A is improved.

Further, the laser beam transmitted through the wavelength conversion element section 312A enters the bandpass filter multilayer film 312B.

In the bandpass filter multilayer film 312B, the laser beam with the conversion wavelength out of the laser beam, which is reflected by the dielectric multilayer film 312C and reenters the wavelength conversion element section 312A, is reflected while transmitting other laser beams. The laser beam with the conversion wavelength reflected by the bandpass filter multilayer film 312B enters the wavelength conversion element section 312A again, and is then emitted from the dielectric multilayer film 312C (the laser source device 31).

Then, the laser beam with the oscillation wavelength entering the laser source 311 resonates with a laser beam newly oscillated in the laser medium 311B.

The intensity of the image beam L (laser beam with the oscillation wavelength) emitted from the laser source device 31 is substantially proportional to the square of the intensity of the laser beam with the oscillation wavelength entering the wavelength conversion element 312 from the laser source 311. Therefore, in order for improving the conversion efficiency, it is important to increase the intensity of the laser beam with the oscillation wavelength in the laser source 311.

As a measure therefor, it is possible for the laser source 311 to have a plurality of laser elements (the mirror layers 311A and the laser mediums 311B) formed adjacent to each other inside a single substrate 400 of the semiconductor wafer, and in this case, the laser beams are emitted in parallel to each other. Thus, the output of the laser beam to be output can be increased without growing the laser source device 31 in size by increasing the number of the laser elements to be formed. Further, in this case, a single wavelength conversion element 312 can commonly be used for a plurality of laser elements.

The laser source device 31 explained hereinabove narrow-bands the laser beam emitted from the laser source 311 by the bandpass filter multilayer film 312B formed on the wavelength conversion element 312 (entrance surface of the wavelength conversion element section 312A). Thus, the output of the laser beam can further be amplified, and it becomes possible to improve the oscillation efficiency of the laser source 311, and to improve the wavelength conversion efficiency of the wavelength conversion element 312, Further, since the laser beam narrow-banded by the bandpass filter multilayer film 312B enters the wavelength conversion element section 312A and the second harmonic wave is generated in the wavelength conversion element section 312A, the laser beam with a constant wavelength can always be emitted from the laser source device 31 even if variation is caused in the oscillation wavelength of the laser beam by the variation in the use environmental temperature.

Further, since the bandpass filter multilayer film 312B has a property of reflecting the light beam with the conversion wavelength, the laser beam with the conversion wavelength, which has been reflected by the dielectric multilayer film 312C as the mirror and then reentered the wavelength conversion element section 312A, is reflected by the bandpass filter multilayer film 312B, and then emitted from the laser source device 31. Thus, the laser beam with the conversion wavelength can be prevented from proceeding on a wasteful light path, thereby preventing the weakening of the output of the laser beam emitted from the laser source device 31. It should be noted that in order for effectively taking out the conversion beam from the laser source device, the bandpass filter multilayer film 312B preferably has a high reflectance to the conversion wavelength, the reflectance no lower than 80 percent is required.

Further, since the laser source device 31 is provided with the bandpass filter multilayer film 312B having the bandpass filter function formed on the entrance surface of the wavelength conversion element section 312A for generating the second harmonic wave and the dielectric multilayer film 312C having the dichroic filter function formed on the opposed surface, the number of components can be reduced, and as a result, cost reduction and downsizing can be achieved.

Further, since the rear projector 1 using the laser source device 31 has the laser source devices (31R, 31B, and 31G) for respective three primary colors, red, blue, and green, separately from each other, filters such as a color separation filter can be eliminated, and since the laser beams emitted from the laser source devices 31 are linear-polarized light beams, it can eliminate a polarization conversion element, thus the projector unit 3 with a simplified configuration can be obtained. Thus, the rear projector 1 allowing the cost reduction and the downsizing (low-profiling) thereof can be obtained. Further, since the laser beam, which is narrow-banded and improved in the oscillation efficiency and the wavelength conversion efficiency, is emitted from the laser source device 31, the rear projector 1 having a wide color reproduction area can be provided, Second Embodiment FIG. 7 is a diagram showing a schematic configuration of the laser source device according to the second embodiment.

The second embodiment is different in the configuration of the laser source device 31 from the first embodiment, and has a similar basic configuration to the first embodiment except the configuration that a bandpass filter 412 is disposed instead of the bandpass filter multilayer film 312B formed on the entrance surface of the wavelength conversion element 312. Accordingly, the same members as in the first embodiment are denoted with the same reference numerals, and the explanations therefor will be omitted or simplified. Further, the same applies to the operation of each of the composing elements, and the detailed explanations will be omitted or simplified.

Configuration of Light Source Device

Figure 7:
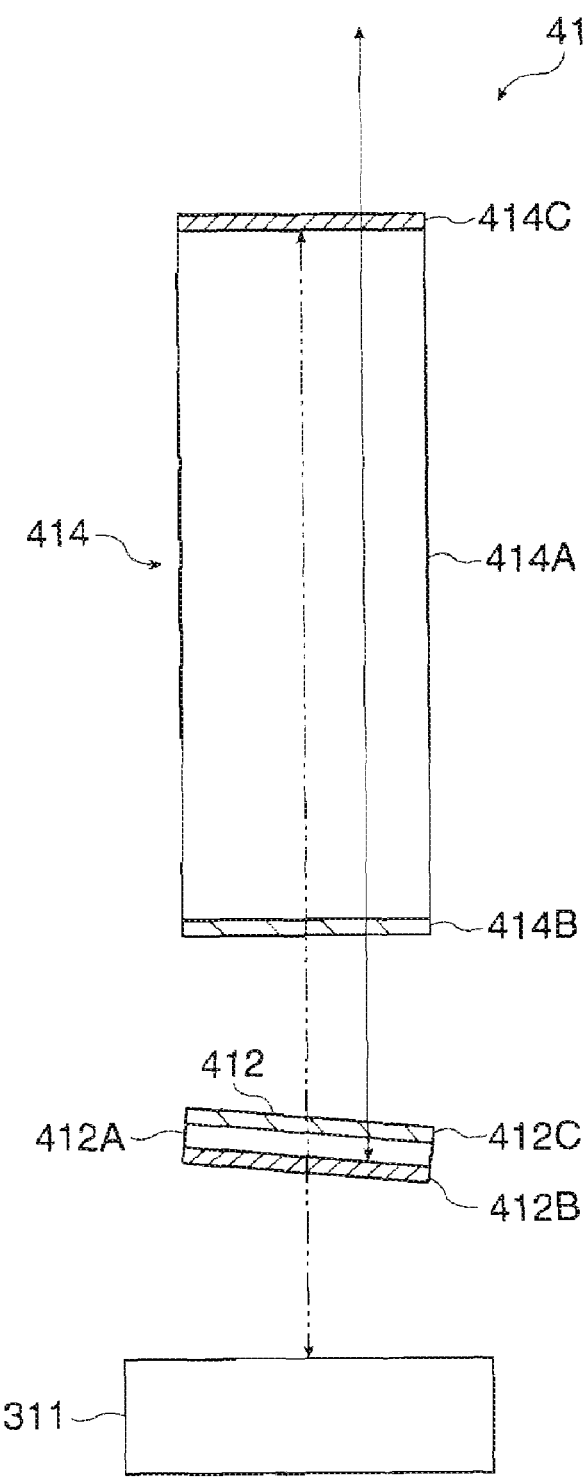
FIG. 7 is a diagram showing a schematic configuration of a laser source device according to a second embodiment.

In FIG. 7, the laser source device 41 is provided with a laser source 311 for emitting a laser beam, the bandpass filter 412, and a wavelength conversion element 414. These composing elements are disposed on the light path of the laser beam emitted from the laser source 311 in the order of the bandpass filter 412 and the wavelength conversion element 414 from the side of the laser source 311.

The bandpass filter 412 has a bandpass filter multilayer film 412B formed on one surface of a glass substrate 412A and an anti-reflective (AR) film 412C for preventing reflection of light formed on the other surface thereof, and is disposed in the light path of the laser beam emitted from the laser source 311 and between the laser source 311 and the wavelength conversion element 414 with the surface on which the bandpass filter multilayer film 412B is formed facing the side of the laser source 311 at a slant with an angle of about 5 degrees with the laser beam emitting surface (the surface substantially perpendicular to the light axis of the laser beam emitted from the laser source 311) of the laser source 311.

It should be noted that either of the case of disposing the surface, on which the bandpass filter multilayer film 412B or the anti-reflective film 412C provided to the bandpass filter 412 is formed, so as to face the laser source 311 and the case of disposing the surface so as to face the wavelength conversion element 414 can be adopted. Further, either of the case in which the bandpass filter 412 disposed at a slant to the laser beam emitting surface of the laser source 311 is tilted to the right and the case in which the bandpass filter 412 is tilted to the left can be adopted.

The bandpass filter multilayer film 412B has a film configuration in which the high refractive index layer H and the low refractive index layer L are alternately stacked from the side of the glass substrate 412A in sequence. The detailed film configuration is the same as that of the bandpass filter multilayer film 312B formed on the entrance surface of the wavelength conversion element 312 in the first embodiment. Therefore, the explanations for the film configuration will be omitted.

The bandpass filter 412 thus configured selectively transmits only the laser beam with a predetermined specific wavelength out of the laser beams with the oscillation wavelength emitted by the laser-source 311, and reflects the laser beams with other oscillation wavelengths. Therefore, it has a function of narrow-banding the laser beam with an oscillation wavelength. Further, the bandpass filter 412 can fine-tune the setting wavelength of the laser beam to be transmitted through the bandpass filter 412 by adjusting the tilt angle with the laser beam emitting surface of the laser source 311. It should be noted that the laser beam with the specific wavelength transmitted through the bandpass filter 412 is a laser beam with a wavelength bandwidth of about 0.5 nm in the setting wavelength.

The wavelength conversion element 414 is provided with a wavelength conversion element section 414A, an anti-reflective film 414B formed on the entrance surface of the wavelength conversion element 414 (the wavelength conversion element section 414A), and a dielectric multilayer film 414C formed on the exit surface of the wavelength conversion element 414 (the wavelength conversion element section 414A). The wavelength conversion element 414 has a function of generating the second harmonic wave of the laser beam with the oscillation wavelength narrow-banded in the bandpass filter 412.

The wavelength conversion element section 414A and the dielectric multilayer film 414C have the same configurations and the same functions as the wavelength conversion element section 312A and the dielectric multilayer film 312C of the first embodiment, respectively.

The wavelength conversion element section 414A performs the wavelength conversion on the laser beam with the oscillation wavelength entering the wavelength conversion element 414 to generate the second harmonic wave with the wavelength half as long as the original wavelength. The dielectric multilayer film 414C selectively transmits the laser beam (the second harmonic wave) with the conversion wavelength converted to be half as long as the original wavelength in the wavelength conversion element section 414A, and at the same time reflects the laser beams with other wavelengths.

Operation of Light Source Device

The operation of the laser source device 41 thus configured will be explained with reference to FIG. 7.

When an electrical current is supplied to the laser medium 311B of the laser source 311, the laser source device 41 oscillates a laser beam with a predetermined wavelength under the control of the control unit 4.

Then, the laser beam with the oscillation wavelength emitted from the laser source 311 enters the bandpass filter 412. The bandpass filter multilayer film 412B performs the narrow-banding of the oscillation wavelength on the laser beam with the oscillation wavelength entering the bandpass filter 412, and transmits the laser beam with the wavelength bandwidth of the oscillation wavelength of about 0.5 nm, and reflects the laser beams with other oscillation wavelengths.

When the bandpass filter 412 is disposed to slant against the laser beam emitting surface of the laser source 311 with the surface on which the bandpass filter multilayer film 412B is formed facing the side of the laser source 311, the laser beam reflected by the bandpass filter multilayer film 412B does not enter the laser source 311. Therefore, it becomes possible to prevent the generation of an unnecessary oscillation structure between the bandpass filter 412 and the laser source 311.

The laser beam with the oscillation wavelength transmitted through the bandpass filter 412 (the bandpass filter multilayer film 412B, the glass substrate 412A, and the anti-reflective film 412C) enters the wavelength conversion element 414.

The laser beam with the oscillation wavelength entering the wavelength conversion element 414 is transmitted through the anti-reflective film 414B, and then partially wavelength-converted in the wavelength conversion element section 414A to generate the laser beam, which is the second harmonic wave with the wavelength (conversion wavelength) converted to be half as long as the original wavelength.

Then, the laser beam with the conversion wavelength, which is wavelength-converted in the wavelength conversion element section 414A, and the laser beam with the oscillation wavelength, which has not been wavelength-converted, enter the dielectric multilayer film 414C formed on the exit surface of the wavelength conversion element 414.

In the dielectric multilayer film 414C, the laser beam (the second harmonic wave.) with the conversion wavelength converted to be half as long as the oscillation wavelength is selectively transmitted, and at the same time the laser beams with other wavelengths are reflected.

The laser beam with the conversion wavelength transmitted through the dielectric multilayer film 414C is emitted from the wavelength conversion element 414 (the laser source device 41) towards the liquid crystal panel 32.

The laser beam with the oscillation wavelength not converted in the wavelength conversion element section 414A reflected in the dielectric multilayer film 414C reenters the wavelength conversion element section 414A and is then wavelength-converted.

Then, the laser beam wavelength-converted in the wavelength conversion element section 414A enters the bandpass filter 412.

Then, in the bandpass filter 412, the laser beam with the conversion wavelength, which has been wavelength-converted, is reflected by the bandpass filter multilayer film 412B formed on the glass substrate 412A, and the rest of the laser beams are transmitted. The laser beam with the conversion wavelength reflected by the bandpass filter multilayer film 412B enters the wavelength conversion element 414 again, and is then emitted from the laser source device 41 (the dielectric multilayer film 414C).

Then, the laser beam with the oscillation wavelength entering the laser source 311 resonates with a laser beam newly oscillated in the laser medium 311B (see FIG. 4.

Then, adjustment of the wavelength of the laser beam to be transmitted through the bandpass filter 412 will be explained.

The wavelength of the laser beam to be transmitted through the bandpass filter 412 can be fine-tuned by adjusting the tilt angle of the bandpass filter 412 disposed on the light path of the laser beam and configured tiltably with respect to the laser emitting surface of the laser source 311, namely by varying the incident angle of the laser beam entering the bandpass filter 412 to the bandpass filter 412.

Figure 8:
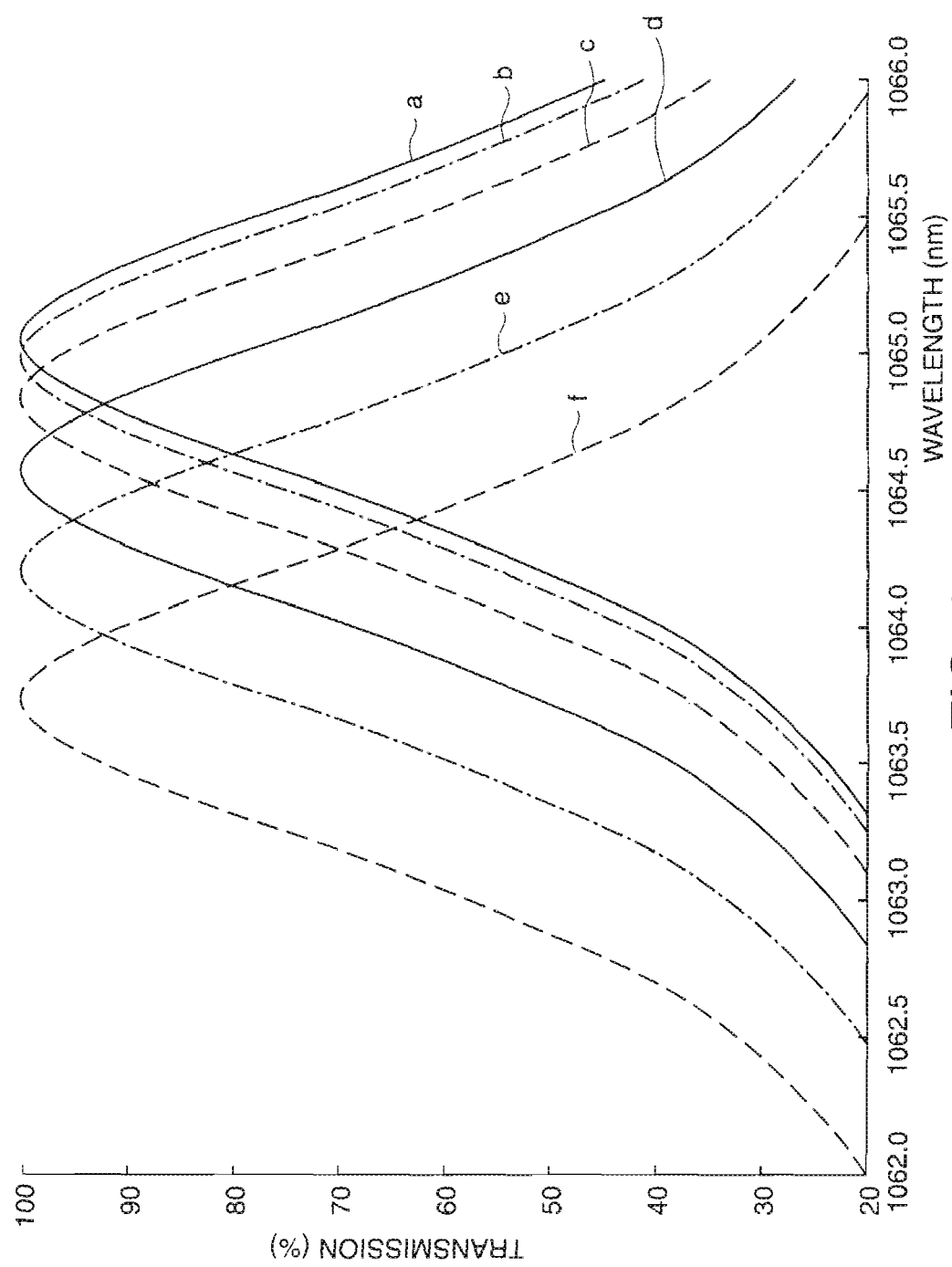
FIG. 8 is a graph showing a transmission wavelength shift characteristic in accordance with a tilt angle of the bandpass filter.

FIG. 8 is a graph showing a transmission wavelength shift characteristic in accordance with the tilt angle of the bandpass filter. The horizontal axis of the graph represents the transmission wavelength (nm) while the vertical axis thereof represents the transmission factor (%). It should be noted that the setting wavelength of the laser beam to be emitted from the laser source 311 is 1064 nm.

A curve a shown in FIG. 8 is a transmission factor curve with the tilt angle of the bandpass filter 412 to the laser beam emitting surface of the laser source 311 of 0°, similarly curves b through f are transmission factor curves with the tilt angles of 1°, 2°, 3°, 4°, 5°, respectively.

In FIG. 8, as the tilt angle of the bandpass filter 412 to the laser beam emitting surface of the laser source 311 increases from 0° towards 5°, it is shifted (moved) in a direction of reducing the wavelength of the laser beam to be transmitted through the bandpass filter 412 (increasing the frequency thereof). Thus, even if a shift is caused in the wavelength of the transmitted light by a manufacturing error of the bandpass filter 412 and so on, it is possible to fine-tune the wavelength of the laser beam to be transmitted thereto by adjusting the tilt angle of the bandpass filter 412, thereby tuning it to the conversion wavelength of the wavelength conversion element 414.

Further, since the bandpass filter 412 is previously disposed with the tilt angle of about 5°, the adjustment for enlarging the wavelength of the laser beam to be transmitted is possible within the tilt angle range of about 0° through about 5°.

According to the laser source device of the second embodiment described hereinabove, the following advantages can be obtained in addition to the advantages of the first embodiment.

Since the bandpass filter 412 provided with the bandpass filter multilayer film 412B is configured tilt ably to the laser beam emitting surface of the laser source 311, the wavelength of the laser beam to be transmitted through the bandpass filter multilayer film 412B can be varied by changing the angle between the laser beam emitted from the laser source 311 and the central axis of the bandpass filter 412.

Thus, even if the shift is caused in the wavelength of the transmission light by a manufacturing error of the bandpass filter 412 and so on, it becomes possible to tune it to the conversion wavelength of the wavelength conversion element 414 by fine-tuning, thus it becomes possible to further improve the oscillation efficiency and the wavelength conversion efficiency of the laser beam, and to emit a more preferable laser beam from the laser source device 41.

Further, it becomes possible to adjust various characteristics of the wavelength conversion element 414 and the bandpass filter 412 independently of each other, thus improvement in the oscillation efficiency and the yield can be expected.

Third Embodiment

Figure 9:
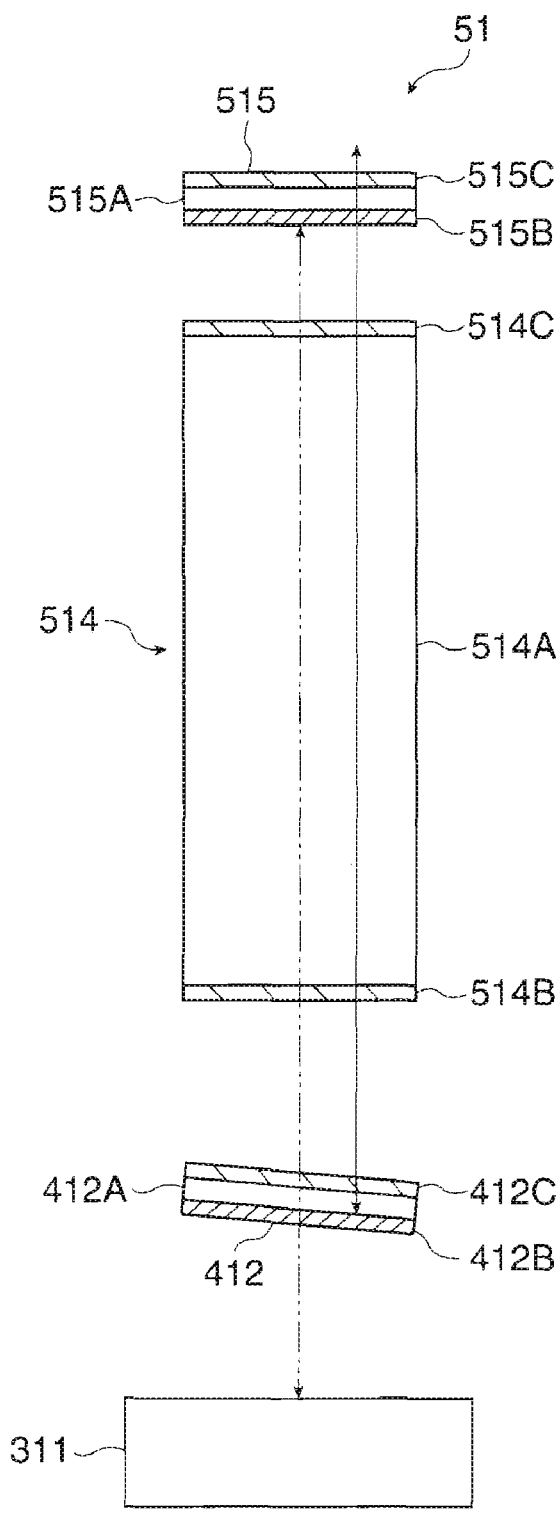
FIG. 9 is a diagram showing a schematic configuration of a laser source device according to a third embodiment.

FIG. 9 is a diagram showing a schematic configuration of the laser source device according to the third embodiment.

A laser source device 51 of the third embodiment is different in the configuration from the laser source device 41 of the second embodiment, and has a similar basic configuration to the first and the second embodiments except that a multilayer film mirror 515 is disposed instead of the dielectric multilayer film 414C provided to the wavelength conversion element 414. Accordingly, the same members as in the first and the second embodiments are denoted with the same reference numerals, and the explanations therefor will be omitted or simplified. Further, the same applies to the operation of each of the composing elements, and the detailed explanations will also be omitted or simplified.

In FIG. 9, the laser source device 51 is provided with the laser source 311 for emitting the laser beam, a wavelength conversion element 514, the bandpass filter 412, and the multilayer film mirror 515 as a mirror. These composing elements are disposed on the light path of the laser beam emitted from the laser source 311 in the order of the bandpass filter 412, the wavelength conversion element 514, and the multilayer film mirror 515 from the side of the laser source 311.

The bandpass filter 412 is the same as the bandpass filter 412 in the second embodiment, and has the same configuration and the same function, and performs the same operation. Therefore, the explanations therefor will be omitted.

The wavelength conversion element 514 is provided with a wavelength conversion element section 514A and anti-reflective films 514B, 514C formed respectively on the entrance surface and the exit surface of the wavelength conversion element, section 514A, and has a function of performing the wavelength conversion on the laser beam with the oscillation wavelength emitted from the laser source 311 to generate the second harmonic wave with the wavelength half as long as the original wavelength.

The wavelength conversion element section 514A has the same configuration and the same function as the wavelength conversion element section 312A in the first embodiment and the wavelength conversion element section 414A in the second embodiment.

The multilayer film mirror 515 is provided with a dielectric multilayer film 515B formed on one surface of a glass substrate 515A as a transparent member, and a anti-reflective film 515C for preventing reflection of the light formed on the other surface thereof, and is disposed so that the dielectric multilayer film 515B faces the side of the wavelength conversion element 514. The dielectric multilayer film 515B of the multilayer-film mirror 515 transmits the laser beam (the second harmonic wave) converted to have the conversion wavelength half as long as the original wavelength in the wavelength conversion element section 514A, and reflects the laser beams with other wavelengths. In this case, in order for improving the oscillation efficiency, the dielectric multilayer film 515B preferably has a high reflectance to the laser beam having the oscillation wavelength, and the reflectance no lower than 80 percent is required. On the other hand, in order for effectively taking out the conversion beam from the laser source device, the dielectric multilayer film 312B preferably has a high transmission to the laser beam having the conversion wavelength, and the transmission no lower than 80 percent is required.

Further, the glass substrate 515A as the transparent member preferably has a high transmission with respect to a laser beam with the conversion wavelength transmitted through the glass substrate 515A in order for effectively taking out the conversion beam from the laser source device, and in the present embodiment, the transmission no lower than 80 percent is provided. On the other hand, in order for improving the oscillation efficiency, the glass substrate 515A as a transparent member preferably has a high reflectivity with respect to the oscillation wavelength, and in the present embodiment, it is made of a material having the transmission no higher than 20 percent. Thus, the loss of the laser beam with the conversion wavelength transmitted through the multilayer film mirror 515 can be reduced, thus the laser source device 51 further improved in the conversion efficiency can be obtained.

Operation of Light Source Device

The operation of the laser source device 51 thus configured as described hereinabove is the same as that of the second embodiment except that the dielectric multilayer film 515B of the multilayer film mirror 515 disposed on the exit side of the wavelength conversion element 514 instead of the dielectric multilayer film 414C provided to the wavelength conversion element 414 in the second embodiment functions similarly, and accordingly, the explanation therefor will be omitted.

According to the laser source device of the third embodiment described hereinabove, the following advantage can be obtained in addition to the advantages of the second embodiment.

In the laser source device 51, by disposing the multilayer film mirror 515 provided with the dielectric multilayer film 515B, it becomes possible to adjust various characteristics of the wavelength conversion element 514, the bandpass filter 412 and the multilayer film mirror 515 independently of each other, thus the improvement in the oscillation efficiency and the yield can further be expected.

Fourth Embodiment

Figure 10:
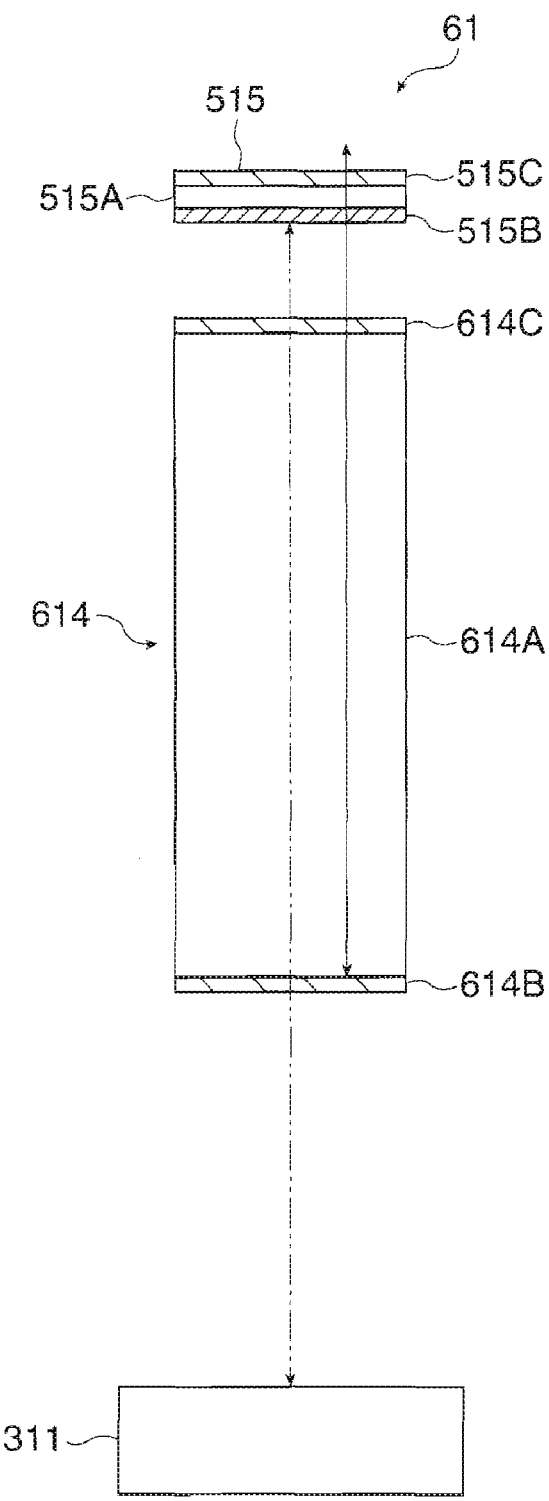
FIG. 10 is a diagram showing a schematic configuration of a laser source device according to a fourth embodiment.

FIG. 10 is a diagram showing a schematic configuration of the laser source device according to the fourth embodiment.

The laser source device 61 of the fourth embodiment is different from the laser source device 51 in the third embodiment in a part of the configuration, and has a similar basic configuration to that of the third embodiment except that a wavelength conversion element 614 provided with a bandpass filter multilayer film 614B exhibiting a bandpass property around the oscillation wavelength and formed on the entrance surface thereof is provided instead of the bandpass filter 412 disposed between the laser source 311 and the wavelength conversion element 514 of the laser source device 51.

It should be noted that an anti-reflective film 614C is provided to the exit surface of the wavelength conversion element section 614A of the wavelength conversion element 614. Further, the film configuration of the bandpass filter multilayer film 614B is the same as that of the bandpass filter multilayer film 312B formed on the entrance surface of the wavelength conversion element section 312A of the wavelength conversion element 312 in the first embodiment.

Therefore, the operation of the laser source device 61 is the same as that of the laser source device 51 in the third embodiment, and the explanations therefor will be omitted.

Fifth Embodiment

Figure 11:
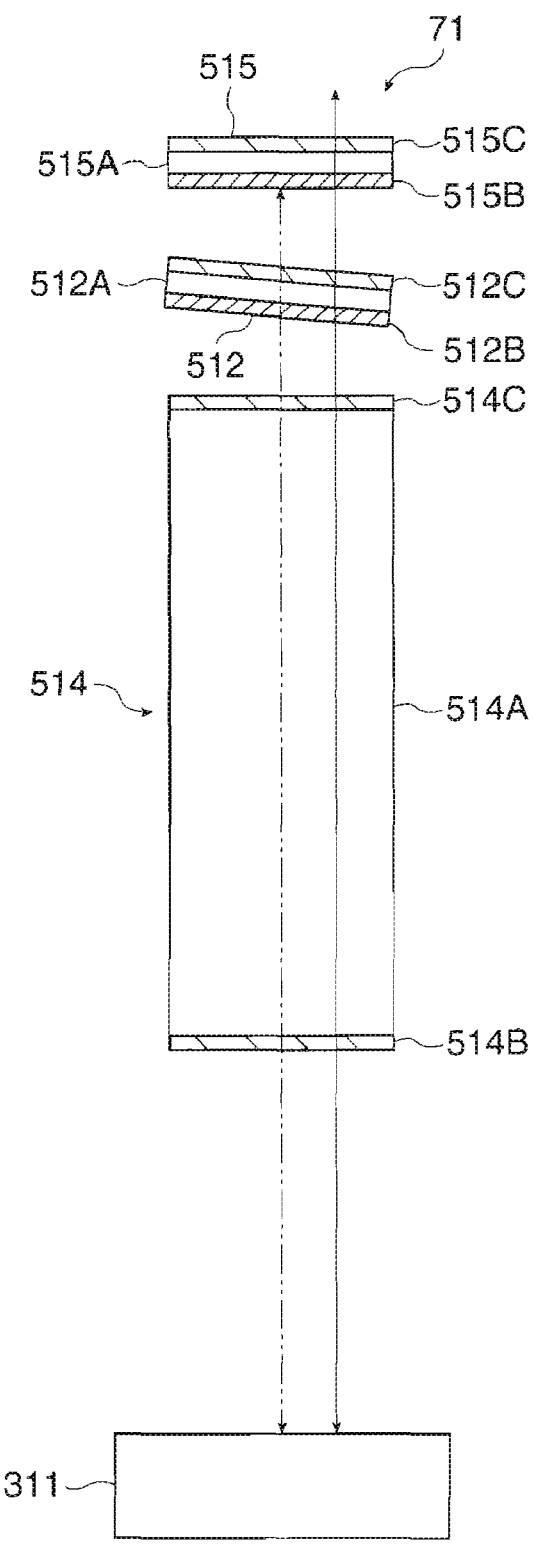
FIG. 11 is a diagram showing a schematic configuration of a laser source device according to a fifth embodiment.

FIG. 11 is a diagram showing a schematic configuration of the laser source device according to the fifth embodiment.

A laser source device 71 of the fifth embodiment is different in the configuration form the laser source device 51 in the third embodiment, and has a similar basic configuration to that of the third embodiment except that the bandpass filter 512, which has been disposed between the laser source 311 and the wavelength conversion element 514, is disposed between the wavelength conversion element 514 and the multilayer film mirror 515. Accordingly, the same members as in the third embodiment are denoted with the same reference numerals, and the explanations therefor will be omitted or simplified. Further, the same applies to the operation of each of the composing elements, and the detailed explanations will also be omitted or simplified, In FIG. 11, the laser source device 71 is provided with the wavelength conversion element 514, the bandpass filter 512, and the multilayer film mirror 515 disposed on the light path of the laser beam emitted from the laser source 311 in this order from the side of the laser source 311. It should be noted that the bandpass filter 512 disposed between the wavelength conversion element 514 and the multilayer film mirror 515 is provided with a bandpass filter multilayer film 512B formed on one surface of the glass substrate 512A and an anti-reflective film 512C for preventing the reflection of light formed on the other surface, and is disposed at a slant with an angle of about 5° to the laser beam emitting surface of the laser source 311 similarly to the case with the laser source device 51 in the third embodiment.

Operation of Light Source Device

The laser beam with the oscillation wavelength emitted from the laser source 311 of the laser source device 71 enters the wavelength conversion element 514.

The laser beam with the oscillation wavelength entering the wavelength conversion element 514 is first partially wavelength-converted in the wavelength conversion element section 514A, and then the laser beam, which is the second harmonic wave converted to have the wavelength (conversion wavelength) half as long as the oscillation wavelength, is generated.

Then, the laser beam with the conversion wavelength, which is wavelength-converted in the wavelength conversion element section 514A, and the light beam with the oscillation wavelength, which has not been wavelength-converted, enter the bandpass filter 512.

In the bandpass filter 512, in the bandpass filter multilayer film 512B formed on one surface of the glass substrate, the laser beam with the wavelength width of about 0.5 nm out of the incident laser beam with the oscillation wavelength is transmitted, thereby performing the narrow-banding of the laser beam with the oscillation wavelength. In this case, the bandpass filter multilayer film 512B according to the present embodiment has a property of transmitting the light beam with the conversion wavelength. In order for effectively taking out the conversion beam from the laser source device, the bandpass filter multilayer film 512B preferably has a high reflectance with respect to the conversion wavelength, and the reflectance no lower 80 percent is required.

The laser beam with the oscillation wavelength, which is narrow-banded in the bandpass filter 512, and transmitted through the bandpass filter 512, enters the multilayer film mirror 515. In the multilayer film mirror 515, in the dielectric multilayer film 515B formed on one surface of the glass substrate, the laser beam with the conversion wavelength is selectively transmitted therethrough, and the rest of the laser beams are reflected. In this case, in order for improving the oscillation efficiency, the dielectric multilayer film 515B preferably has a high reflectance to the laser beam having the oscillation wavelength, and in the present embodiment, the reflectance no lower than 80 percent is provided. On the other hand, in order for effectively taking out the conversion beam, from the laser source device, the dielectric multilayer film 515B preferably has a high transmission to the laser beam having the conversion wavelength, and the transmission no lower than 80 percent is required.

Then, the laser beam with the conversion wavelength transmitted through the multilayer film mirror 515 is emitted towards the liquid crystal panel 32.

On the other hand, the laser beam with the oscillation wavelength reflected by the multilayer mirror 515 enters the wavelength conversion element 514 again. The laser beam with the conversion wavelength, which has been wavelength-converted by the wavelength conversion element 514, is reflected by the laser source 311 (mirror layer 311A), enters the multilayer film mirror 515 again, and is then emitted from the laser source device 71.

According to the laser source device of the fifth embodiment described hereinabove, similar advantages to the case with the third embodiment can be obtained.

Modified Example of Embodiments

The invention is not limited to the embodiments described above, but includes modifications and improvements in a range where the advantages of the invention can be achieved.

Even in the forms cited as modified examples below, the same advantages as in the embodiments described above can be obtained.

Modified Embodiment 1

In the first through fifth embodiments, although the case in which the laser source 311 of a surface emitting semiconductor laser is used as the laser source devices 31, 41, 51, 61, and 71 housed in the projector unit 3 is explained, a so-called edge emitting semiconductor laser or a diode-pumped solid-state laser can also be used instead of the surface emitting semiconductor laser.

FIG. 11 is a schematic diagram showing a partial configuration of another laser source device as the modified example, and shows a partial configuration of a laser source device using an edge emitting semiconductor laser as the laser source. It should be noted that the configuration part shown in FIG. 11 is disposed instead of the laser source 311 in the first through fifth embodiment.

Figure 12:
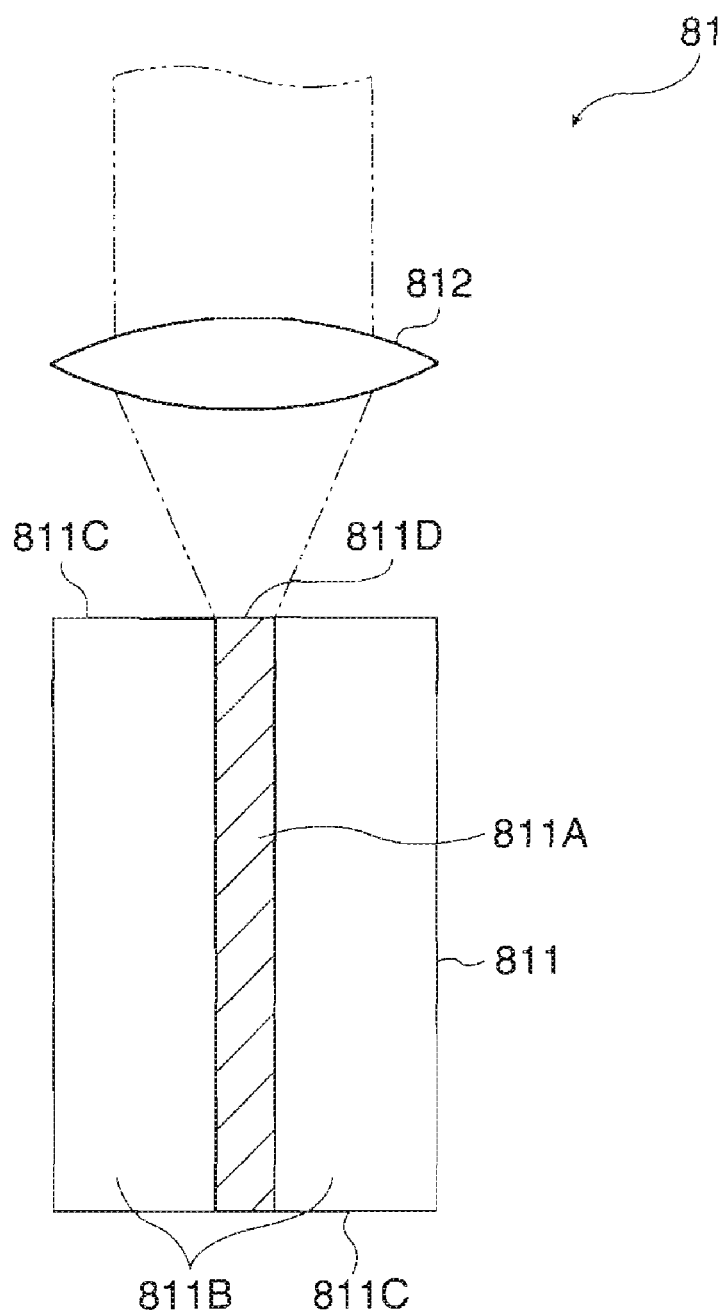
FIG. 12 is a schematic diagram showing a partial configuration of a laser source device as a modified example.

In FIG. 12, the laser source device 81 is provided with an elongated laser source 811, and a parallel lens 812. The laser beam emitted from the laser source 811 enters each composing element (not shown) disposed on the exit side of the laser source 311 in the first through fifth embodiments after passing through the parallel lens 812.

The laser source 811 is a so-called edge emitting semiconductor laser in which an elongated laser medium 811A is sandwiched between cladding layers 811B.

On the both end surfaces of the laser medium 811A in the elongated direction, there are formed mirror layers 811C each having a function as a reflecting mirror. The laser medium 811A is provided with current supply means not shown, and oscillates the laser beam with a predetermined oscillation wavelength in response to a predetermined amount of current being supplied from the current supply means under the control of the control unit 4. Then, the oscillated laser beam is reflected between the mirror layers 811C formed on the both end surfaces of the laser medium 811A, thereby resonating the laser beam to amplify the output thereof.

The mirror layer 811C is provided with an exit section 811D facing the parallel lens 812 as beam parallelizing means, and the oscillated laser beam is emitted from the exit section 811D. The parallel lens 812 converts the laser beam with the oscillation wavelength emitted from the exit section 811D of the laser source 811 into a parallel light beam.

Then, the laser beam with the oscillation wavelength converted into the parallel light beam in the parallel lens 812 proceeds towards the side of the wavelength conversion element, and the laser beam with the conversion wavelength is emitted from the laser source device 81 towards the liquid crystal panel 32 after passing through each of the composing elements.

Modified Embodiment 2

In the first through fifth embodiments, although the case in which the laser source devices 31 forming the projector unit 3 includes the red light source device 31R, the blue light source device 31B, and the green light source device 31G having a similar basic configuration to each other is explained, this is not a limitation. In other words, by selecting an appropriate material as the semiconductor laser element forming the laser medium, the red laser beam and the blue laser beam can be oscillated directly from the laser source. Therefore, it is also possible to adopt a configuration in which the surface emitting semiconductor laser oscillator or the edge emitting semiconductor laser oscillator in the related art is provided to each of the red light source device 31R and the blue light source device 31B, and the laser source device shown in each of the embodiments is applied only to the green light source device 31G.

Modified Embodiment 3

In the first through fifth embodiments, although LN (LiNbO$_3$) and LT (LiTaO$_3$) are previously exemplified as the non-linear optical material composing the wavelength conversion elements 312, 414, 514, and 614, besides these materials, inorganic non-linear optical materials such as KNbO$_3$, BNN (Ba$_2$NaNb$_5$O$_{15}$), KTP (KTiOPO$_4$), KTA (KTiOAsO$_4$), BBO (β-BaB$_2$O$_4$), LBO (LiB$_3$O$_7$) can also be utilized. Further, small molecule organic materials such as metanitroaniline, 2-methyl-4-nitroaniline, chalcone, dicyanovinyl-anisole, 3,5-dimethyl-1-(4-nitrophenyl)pyrasole, or N-methoxymethyl-4-nitroaniline, and organic nonlinear optical materials such as poled polymer can also be utilized.

Modified Embodiment 4

In the second, third, and fifth embodiments, the anti-reflective film 414B, 514B on the entrance side surface of the wavelength conversion element may be replaced with a dielectric multilayer film having a property of transmitting the laser beam with the oscillation wavelength and reflecting the laser beam with the conversion wavelength. In this case, the laser beam with the conversion wavelength reflected by the multilayer film mirror and the laser beam with the conversion wavelength generated by the wavelength conversion element converting the laser beam with the oscillation wavelength reflected by the multilayer film mirror are reflected by the dielectric multilayer film provided on the entrance side surface of the wavelength conversion element and are emitted from the multilayer film mirror towards the liquid crystal panel. It should be noted that the dielectric multilayer film preferably has a high transmission to the laser beam with the oscillation wavelength, the transmission no lower than 80 percent is preferable. On the other hand, the dielectric multilayer film preferably has a high reflectance to the laser beam with the conversion wavelength, and reflectance no lower than 80 percent is also preferable.

Modified Embodiment 5

In the first through fifth embodiments, although the case in which the second harmonic wave generation element for generating the second harmonic wave having a wavelength half as long as the oscillation wavelength of the laser beam oscillated in the laser source 311 is used for the wavelength conversion elements (312, 414, and 514) is explained, the case in which the third harmonic wave generation element is used instead of the second harmonic wave generation element can be adopted.

Modified Embodiment 6

In the first through fifth embodiment and the modified embodiment 1, although the case in which the laser source devices 31, 41, 51, 61, 71, and 81 for composing the projector unit 3 are equipped in the rear projector 1 is exemplified, but this is not a limitation. The laser source devices can also be applied to other types of projectors such as a front projector. Further, as the light modulation device for composing the projection unit 3, for example, a digital micromirror device can be adopted in addition to a transmissive liquid crystal light valve and a reflective liquid crystal light valve.

The entire disclosure of Japanese Patent Application Nos. 2006-219345, filed Aug. 8, 2006 and 2007-147741, filed Jun. 4, 2007 expressly incorporated by reference herein.

What is claimed is:

1. A laser source device comprising:
a laser source for oscillating a laser beam with a predetermined wavelength;
a mirror for reflecting the laser beam emitted from the laser source to form a resonator, and including a dielectric multilayer film having a property of reflecting a light beam with an oscillation wavelength and transmitting a light beam with a conversion wavelength;
a wavelength conversion element disposed between the laser source and the mirror for converting the laser beam with the oscillation wavelength emitted from the laser source and emitting a laser beam with the conversion wavelength; and
a bandpass filter disposed between the laser source and the mirror, and including a bandpass filter multilayer film having a bandpass property at least around the oscillation wavelength.

2. The laser source device according to claim 1,
wherein the mirror is formed of the dielectric multilayer film formed on a surface of an exit side of the wavelength conversion element, and
the bandpass filter is formed of the bandpass filter multilayer film formed between the laser source and the wavelength conversion element.

3. The laser source device according to claim 2,
wherein the bandpass filter is formed of the bandpass filter multilayer film formed on a surface on an entrance side of the wavelength conversion element.

4. The laser source device according to claim 1,
wherein the mirror is formed of a transparent member provided with the dielectric multilayer film and disposed on an exit side of the wavelength conversion element, and
the bandpass filter is formed of the bandpass filter multilayer film formed between the laser source and the wavelength conversion element.

5. The laser source device according to claim 4,
wherein the bandpass filter is formed of the bandpass filter multilayer film formed on a surface on an entrance side of the wavelength conversion element.

6. The laser source device according to claim 1,
wherein the mirror is formed of a transparent member provided with the dielectric multilayer film and disposed on an exit side of the wavelength conversion element, and
the bandpass filter is formed of the bandpass filter multilayer film formed between the mirror and the wavelength conversion element.

7. The laser source device according to claim 1,
wherein the bandpass filter multilayer film further has a property of reflecting a laser beam with the conversion wavelength.

8. The laser source device according to claim 6,
wherein the bandpass filter multilayer film further has a property of transmitting a laser beam with the conversion wavelength.

9. The laser source device according to claim 1,6 further comprising
a dielectric multilayer film having a property of transmitting the laser beam with the oscillation wavelength and reflecting the laser beam with the conversion wavelength disposed on a surface of an entrance side of the wavelength conversion element.

10. The laser source device according to claim 1,
wherein the bandpass filter multilayer film has high refractive index layers H and low refractive index layers L stacked alternately with optical film thicknesses in sequence from the side of the wavelength conversion element, assuming the oscillation wavelength as $\lambda$, 0.236 $\lambda$H, 0.355 $\lambda$L, 0.207 $\lambda$H, 0.203 $\lambda$L, (0.25 $\lambda$H, 0.25 $\lambda$L)n, 0.5 $\lambda$H, (0.25 $\lambda$L, 0.25 $\lambda$H)n, 0.266 $\lambda$L, 0.255 $\lambda$H, 0.248 $\lambda$L, 0.301 $\lambda$H, and 0.631 $\lambda$L,
where n is a value in a range from 3 to 10, and denotes the number of times of repeating stacking the layers in the parentheses.

11. The laser source device according to claim 1,
wherein the bandpass filter is tiltable with respect to the laser beam emitted from the laser source.

12. The laser source device according to claim 1,
wherein the mirror is formed of a transparent member provided with the dielectric multilayer film,
the dielectric multilayer film has a transmission no lower than 80 percent with respect to the conversion wavelength and a transmission no higher than 20 percent with respect to the oscillation wavelength, and
the transparent member is made of a material having a transmission no lower than 80 percent with respect to the conversion wavelength and a transmission no higher than 20 percent with respect to the oscillation wavelength.

13. The laser source device according to claim 1,
wherein the laser source is one of an edge emitting semiconductor laser, a surface emitting semiconductor laser, and a diode-pumped solid-state laser.

14. The laser source device according to claim 1,
wherein the wavelength conversion element is a second harmonic wave generating element having a periodic polarization inversion structure.

15. A projector comprising:
the laser source device according to claim 1;
a light modulation element for modulating the laser beam emitted from the laser source device in accordance with image information; and
a projection optical system for emitting the modulated laser beam.

* * * * *